US008803722B2

(12) United States Patent
Iadanza

(10) Patent No.: US 8,803,722 B2
(45) Date of Patent: *Aug. 12, 2014

(54) RESISTOR-2 RESISTOR (R-2R) DIGITAL-TO-ANALOG CONVERTER WITH PARTIAL RESISTOR NETWORK RECONFIGURATION

(75) Inventor: Joseph A. Iadanza, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 1 day.

This patent is subject to a terminal disclaimer.

(21) Appl. No.: 13/526,806

(22) Filed: Jun. 19, 2012

(65) Prior Publication Data

US 2013/0335248 A1  Dec. 19, 2013

(51) Int. Cl.
*H03M 1/78* (2006.01)
(52) U.S. Cl.
USPC .......................................... 341/154
(58) Field of Classification Search
USPC ................... 341/145, 144, 154, 161
See application file for complete search history.

(56) References Cited

U.S. PATENT DOCUMENTS

| 4,491,825 | A | | 1/1985 | Tuthill | |
|---|---|---|---|---|---|
| 5,648,780 | A | * | 7/1997 | Neidorff | 341/154 |
| 5,726,652 | A | | 3/1998 | Giuroiu | |
| 6,222,473 | B1 | | 4/2001 | Castaneda et al. | |
| 6,897,794 | B2 | | 5/2005 | Kuyel et al. | |
| 7,088,274 | B2 | | 8/2006 | Shill | |
| 7,233,274 | B1 | * | 6/2007 | Kuhn | 341/161 |
| 7,336,211 | B1 | | 2/2008 | Lai et al. | |
| 7,362,253 | B2 | * | 4/2008 | Ko | 341/144 |
| 7,414,561 | B1 | | 8/2008 | Brubaker | |
| 7,468,686 | B2 | | 12/2008 | Brubaker | |
| 2001/0033242 | A1 | * | 10/2001 | Castaneda et al. | 341/154 |
| 2004/0257254 | A1 | * | 12/2004 | Jiang et al. | 341/145 |
| 2011/0037630 | A1 | | 2/2011 | McLachlan et al. | |

OTHER PUBLICATIONS

International Search Report and Written Opinion dated Aug. 30, 2013 in related PCT Application No. PCT/US2013/041089, 7 pages.

\* cited by examiner

*Primary Examiner* — Jean B Jeanglaude
(74) *Attorney, Agent, or Firm* — David Cain; Roberts Mlotkowski Safran & Cole, P.C.

(57) ABSTRACT

A resistor-2 resistor (R-2R) digital-to-analog converter with partial resistor network reconfiguration. A circuit includes a plurality of resistor stacks. The circuit also includes a plurality of separation resistors which separate each of the plurality of resistor stacks. The circuit further includes a first selection circuit connected to a first resistor stack of the plurality of resistor stacks and a plurality of selection circuits connected between the plurality of separation resistors. The circuit also includes a termination resistor stack connected to a drain of the first resistor stack.

23 Claims, 8 Drawing Sheets

US 8,803,722 B2

RESISTOR-2 RESISTOR (R-2R) DIGITAL-TO-ANALOG CONVERTER WITH PARTIAL RESISTOR NETWORK RECONFIGURATION

FIELD OF THE INVENTION

The invention relates to semiconductor structures and, more particularly, to a resistor-2 resistor (R-2R) digital-to-analog converter with partial resistor network reconfiguration and methods of use.

BACKGROUND

In order to implement human-computer interfaces such as display monitors and audio outputs, computer systems employ digital-to analog (DAC) circuits, which convert digital vectors or addresses to an analog voltage or current. Additionally, DAC circuits are used in a plethora of applications within integrated circuits (ICs) to control, tune, calibrate or test larger more complex systems.

Simulations are used to establish a minimum voltage $V_{min}$ and a maximum voltage $V_{max}$, as defined by equations (1) and (2), respectively, at a DAC output.

$V_{min}$=DAC output with the digital address input minimized    Equation (1); and $V_{max}$=DAC output with the digital address input maximized    Equation (2).

These voltages $V_{max}$, $V_{min}$ are used to calculate an expected DAC output voltage $VOUT_{EXPECT}$, as defined by equations (3)-(5), at each digital address value and an expected change in output voltage value between two digital addresses that differ by one bit.

$VOUT_{EXPECT}$=(LSB*BIN2DEC(Digital Address))+$V$min    Equation (3);

LSB=($V_{max}$-$V_{min}$)/MAXSTEPS    Equation (4); and

MAXSTEPS=($2^N$-1), where $N$=a width of a digital address vector    Equation (5).

Once data for these calculations is taken, the digital address is stepped from its minimum value to its maximum value in one bit increments while measuring the output voltage at each step. An ideal DAC output is a stair-step where each plateau or tread represents a voltage equivalent of a digital address input, and a voltage output rises as the digital address input increments from its lowest value to its highest value.

These calculations are also used to determine three measures of DAC circuit quality: (i) integral non-linearity (INL), as defined by equation (6); (ii) differential non-linearity (DNL), as defined by equation (7); and (iii) monotonicity of the circuit. Illustratively, INL=($VOUT_{MEASURED}$-$VOUT_{EXPECT}$)/LSB    Equation (6); and DNL=($VOUT_{MEASURED(ADDRESS)}$-$VOUT_{MEASURED(ADDRESS-1)}$)/LSB    Equation (7).

INL is a measurement of how closely a voltage measurement at a DAC output matches predicted values at each address step, i.e., when a digital address increases by one bit. DNL is a measurement of how closely the measured voltage step between two consecutive addresses matches the ideal LSB step value computed for the DAC measured at each address step. INL and DNL values between +/-1.0 LSB are desirable. The DAC is monotonic when a direction of a DAC output voltage changes in the same direction as the change of a digital address change, i.e., when the digital address increases, the DAC output voltage increases, and vice-versa.

Example DAC circuits include a ladder DAC and R-2R DAC. A ladder DAC includes a series of resistors, e.g., a resistor ladder, placed between an upper reference voltage supply and ground, or alternatively, a lower reference voltage supply. The resistor ladder sinks current between the voltage supply and ground, and acts as a multiple-tap voltage divider. Selection switches at each resistor connection point selectively connect a ladder node to an output node of the DAC based on the digital address. In implementation, the ladder DAC requires at least $2^N$ resistors and $2^N$ selection elements, where N is the number of bits in the digital address. Although ladder DACs provide good INL, DNL and monotonic performance, physical implementations become large, and an effective impedance between the voltage supply, ground, and a DAC output increases as the number of bits increases, thus limiting transient performance.

The R-2R DAC includes a plurality of resistor stacks separated by a separation resistor. Each bit of the digital address determines whether a source terminal of a resistor stack unique to that digital address bit is driven from either the voltage supply or ground, or alternatively, a lower reference voltage supply. A drain of a resistor stack associated with a most-significant-bit (MSB) is connected to the DAC output. In addition, the R-2R DAC includes a resistor stack disposed between ground and a drain of a resistor stack associated with a least-significant-bit.

An R-2R DAC is efficient in its use of resistors and selection elements. More specifically, the number of resistors required is determined by (3*N)+1 and the number of selection elements is determined by 2*N, where N is the number of digital address bits. Thus, R-2R DACs compare favorably to ladder DACs in terms of silicon area and impedance between the voltage supply, ground, and the DAC output, resulting in faster transient response.

In an R-2R DAC, worst case INL and DNL values occur at a half-address switch, e.g., for example, in a 7-bit DAC, the half address switch occurs when a digital address switches from 0111111 to 1000000. This is because of an error between an actual resistance value of the resistor stack, e.g., the resistor stack associated with the MSB, due to device mismatch and an ideal value of the resistor stack. As a result, the error swings a voltage of the DAC in opposite directions at the half address switch. Thus, at the half address switch, the DAC output step may be less than the value expected for the LSB and in some cases, may decrease rather than increasing as expected. Thus, the DAC then becomes non-monotonic at the half-address switch.

Although, R-2R DACs with larger resistors provide desirable INL and DNL performance, the area of the resistors far outweighs the area required to implement selection devices, e.g., transistors, for decode logic of an R-2R DAC. Therefore, the large resistor size is a negative in terms of integration/use in larger analog structures. However, R-2R DACs with a smaller resistor area yield undesirable DNL values. Further, similar to the R-2R DAC with larger resistors, the worst case INL and DNL performance occurs at the half address switch. More specifically, at the half address switch, the R-2R DAC then becomes non-monotonic.

Accordingly, there exists a need in the art to overcome the deficiencies and limitations described hereinabove.

BRIEF SUMMARY

In an aspect of the invention, a circuit comprises a plurality of resistor stacks. The circuit also comprises a plurality of separation resistors which separate each of the plurality of resistor stacks. The circuit further comprises a first selection circuit connected to a first resistor stack of the plurality of resistor stacks and a plurality of selection circuits connected between the plurality of separation resistors. The circuit also comprises a termination resistor stack connected to a drain of the first resistor stack.

In an aspect of the invention, a circuit comprises a plurality of resistor stacks. The circuit also comprises a plurality of separation resistors which separate the number of resistor stacks. The circuit further comprises a selection circuit connected to a first resistor stack of the plurality of resistor stacks, the selection circuit comprising a buffer and an OR gate, and a plurality of selection circuits connected to a respective remaining one of the plurality of resistor stacks, the plurality of selection circuits comprising a tri-state buffer. The circuit also comprises a termination resistor stack connected to a drain of the first resistor stack.

In an aspect of the invention, a method comprises providing a half address value (HA) to a plurality of resistor stacks. The method also comprises determining a source connection of the plurality of resistor stacks based on the half address value.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of an R-2R digital-to-analog converter with partial resistor network reconfiguration, which comprises the structures of the present invention. In still further embodiments, a method in a computer-aided design system is provided for generating a functional design model of the R-2R digital-to-analog converter with partial resistor network reconfiguration. The method comprises generating a functional representation of the structural elements of the R-2R digital-to-analog converter with partial resistor network reconfiguration.

BRIEF DESCRIPTION OF THE SEVERAL VIEWS OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein.

DETAILED DESCRIPTION

The invention relates to semiconductor structures and, more particularly, to an R-2R digital-to-analog converter (DAC) with partial resistor network reconfiguration and methods of use. In embodiments, the DAC with partial resistor network reconfiguration includes a plurality of resistor stacks separated by a separation resistor. Additionally, the DAC with partial resistor network reconfiguration includes a termination resistor stack connected to a common node between a drain of a first resistor stack of the plurality of resistor stacks and a drain of a first separation resistor of the plurality of separation resistors. The termination resistor stack is connected to ground, or alternatively, a lower reference voltage supply, by a selection gate. In embodiments, the DAC with partial resistor network reconfiguration also includes an output connected to a common node between a drain of a last resistor stack of the plurality of resistor stacks and a last separation resistor of the plurality of separation resistors.

Further, in embodiments, the DAC with partial resistor network reconfiguration includes a respective selection circuit connected to each of the plurality of resistor stacks. In embodiments, the selection circuit for the first resistor stack of the plurality of resistor stacks includes an OR gate and a buffer, and the selection circuit for all other resistor stacks includes a tri-state buffer.

According to aspects of the present invention, the present invention advantageously resolves the INL issue at the half address, e.g., reduces INL values to desirable levels at the half address. More specifically, the present invention recognizes that worst case values of INL occur at a voltage of 0.5* (VREF1−VREF2), e.g., the half address. According to aspects of the present invention, the R-2R DAC with partial resistor network reconfiguration advantageously generates a voltage at the half address which reduces the INL to desirable levels.

Figure 1:
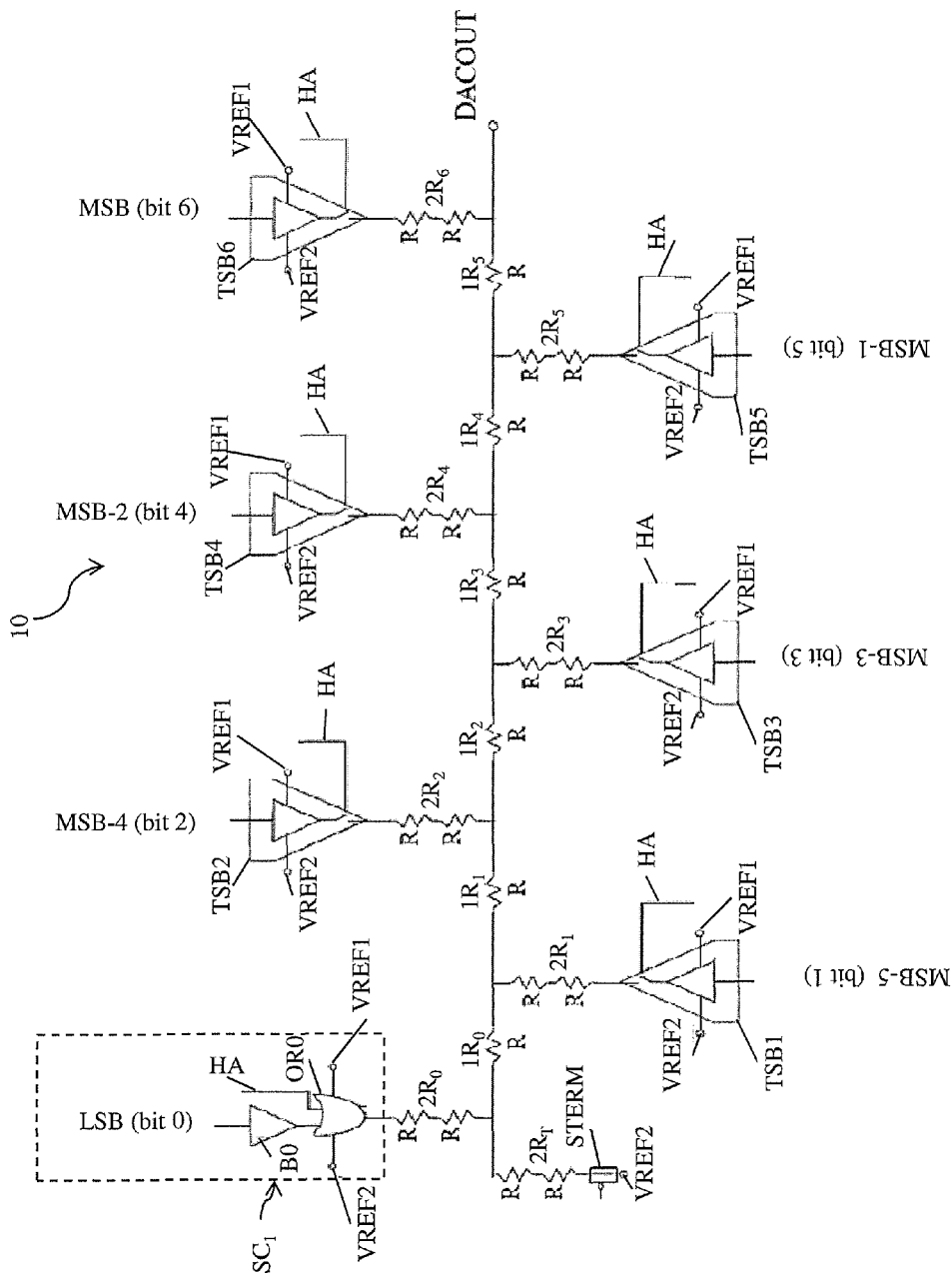
FIG. 1 shows an R-2R digital-to-analog converter (DAC) with partial resistor network reconfiguration in accordance with aspects of the present invention.

FIG. 1 shows the R-2R DAC with partial resistor network reconfiguration. More specifically, the R-2R DAC with partial resistor network reconfiguration 10 includes a plurality of resistor stacks $2R_0$-$2R_6$, which each convert a bit of a digital address into an analog signal. In embodiments, the resistor stacks $2R_0$-$2R_6$ include two resistors in series each having a resistance R. The resistor stacks $2R_0$-$2R_6$ are selectively coupled to a respective voltage supply VREF1 and ground VREF2.

In embodiments, the resistor stacks $2R_0$-$2R_6$ are separated by resistors $1R_0$-$1R_5$. More specifically, separation resistor $1R_0$ separates a drain of the resistor stack $2R_0$ from a drain of the resistor stack $2R_1$, separation resistor $1R_1$ separates a drain of resistor stack $2R_1$ from a drain of resistor stack $2R_2$, etc. Although the DAC with partial resistor network reconfiguration 10 of FIG. 1 is shown with seven resistor stacks, it should be understood by those of ordinary skill in the art that the present invention may be implemented with any number of resistor stacks depending on a length of the digital address.

In embodiments, an output DACOUT is connected to a common node between a drain of resistor stack $2R_6$ and a drain of separation resistor $1R_5$. Additionally, in embodiments, the R-2R DAC with partial resistor network reconfiguration 10 includes a termination resistor stack $2R_T$ connected to a common node between the drain of the resistor stack $2R_0$ and a drain of the separation resistor $1R_0$. In embodiments, the termination resistor stack $2R_T$ includes two resistors having a resistance R. The termination resistor stack $2R_T$ is coupled to ground VREF2, or alternatively, a lower reference voltage supply, by a selection gate STERM. In embodiments, the selection gate STERM is configured to be on and is used to balance an impedance contribution of other selection devices in the R-2R DAC with partial resistor network reconfiguration 10.

In embodiments, the R-2R DAC with partial resistor network reconfiguration 10 further includes selection circuits coupled to a respective resistor stack $2R_0$-$2R_6$. More specifically, in embodiments, a selection circuit $SC_1$ coupled to the resistor stack $2R_0$ includes a buffer B0 and an OR gate OR0. In embodiments, a least-significant-bit of the digital address is provided as an input to the buffer B0, and a half address signal HA and an output of the buffer B0 are provided to the OR gate OR0 as inputs. In embodiments, the half address signal HA occurs when a most-significant-bit is 1 and all other bits are 0. For example, when the digital address includes seven bits, the half address HA occurs at the digital address 1000000.

In embodiments, when HA=0, the least-significant-bit controls a source of the resistor stack $2R_0$, and when HA=1, the resistor stack $2R_0$ is sourced from a voltage supply VREF1. More specifically, whenever the half address signal HA is asserted, e.g., HA=1, the selection circuit SC1 drives the source of resistor stack $2R_0$ to the voltage supply VREF1; whereas, whenever the half address HA is usasserted, e.g., HA=0, the selection circuit SC1 selects a source for the resistor stack $2R_0$ based on the value of the least-significant-bit.

Table 1 shows a truth table for the source of the resistor stack $2R_0$ based on the half address HA and the least-significant-bit. For example, when HA=0 and the least-significant-bit is 0, the resistor stack $2R_0$ is connected to ground VREF2; whereas, when HA=0 and the least-significant-bit is 1, the resistor stack $2R_0$ is connected to the voltage supply VREF1. In contrast, when HA=1, the resistor stack $2R_0$ is sourced from the voltage supply VREF1.

TABLE 1

| HA | least-significant-bit | Source |
|----|----------------------|--------|
| 0  | 0                    | VREF2  |
| 0  | 1                    | VREF1  |
| 1  | 0                    | VREF1  |

Additionally, in embodiments, the resistor stacks $2R_1$-$2R_6$ are selectively coupled to selection circuits, e.g., tri-state buffers $TSB_1$-$TSB_6$. More specifically, the resistor stacks $2R_1$-$2R_6$ are coupled to the tri-state buffers $TSB_1$-$TSB_6$ based on a value of the half address signal HA. For example, in embodiments, when HA=0, the tri-state buffers $TSB_1$-$TSB_6$ are connected to the resistor stacks $2R_1$-$2R_6$. As a result, the tri-state buffers $TSB_1$-$TSB_6$ drive a voltage supply VREF1 or ground VREF2 onto a source of each of the resistor stacks $2R_1$-$2R_6$ based on an assigned digital address input bit. For example, the resistor stack $2R_1$ receives the least-significant-bit+1 (also referred to as most-significant-bit (MSB)–5) to control the source of the resistor stack $2R_1$, etc. In this way, the source of each resistor stack, e.g., resistor stacks $2R_1$-$2R_6$, is driven by an associated digital address input bit. In contrast, when HA=1, the tri-state buffers $TSB_1$-$TSB_6$ tri-state, such that the resistor stacks $2R_1$-$2R_6$ have a high impedance source connection.

Table 2 shows a truth table for the source of the resistor stacks $2R_1$-$2R_6$ based on the half address signal HA value and a respective bit value provided to the resistor stacks $2R_1$-$2R_6$. For example, when HA=0 and the respective bit value=0, the resistor stacks $2R_1$-$2R_6$ are connected to ground VREF2, and when HA=0 and the respective bit value=1, the resistor stacks $2R_1$-$2R_6$ are sourced by the voltage supply VREF1. In contrast, when HA=1, the tri-state buffers $TSB_1$-$TSB_6$ are tri-stated as should be understood by those of ordinary skill in the art, and as a result, the resistor stacks $2R_1$-$2R_6$ have a high impedance source connection. Accordingly, no current flows through and no voltage division occurs in the resistor stacks $2R_1$-$2R_6$. More specifically, when the half address HA is asserted, e.g., HA=1, the tri-state buffers $TSB_1$-$TSB_6$ for all bits other than the least-significant-bit go into a high impedance state and the stack resistors $2R_1$-$2R_6$ do not contribute to the output DACOUT. In contrast, when the half address HA is unasserted, e.g., HA=0, bits above the least-significant-bit contribute to the output DACOUT.

TABLE 2

| HA | Respective Bit Value | Source |
|----|----------------------|--------|
| 0  | 0                    | VREF2  |
| 0  | 1                    | VREF1  |
| 1  | 0 or 1               | High Impedance |

Thus, when HA=0, the DAC with partial resistor network reconfiguration 10 functions like a conventional R-2R DAC; however, when HA=1, the resistor stacks $2R_1$-$2R_6$ do not contribute to the output DACOUT, which is now formed as a voltage divider between the voltage supply VREF1 and ground VREF2 comprised of the resistor stack $2R_0$ and the termination resistor stack $2R_T$. Because the resistor stack $2R_0$ and the termination resistor stack $2R_T$ are equally sized and effects of the resistor stack $2R_0$ have previously been seen in least-significant-bit address switches, the INL values of the R-2R DAC with partial resistor network reconfiguration 10 are reduced. Further, although the separation resistors $1R_0$-$1R_5$ remain in the network, these resistors do not contribute to mismatch as no current flows through them.

Figure 2:
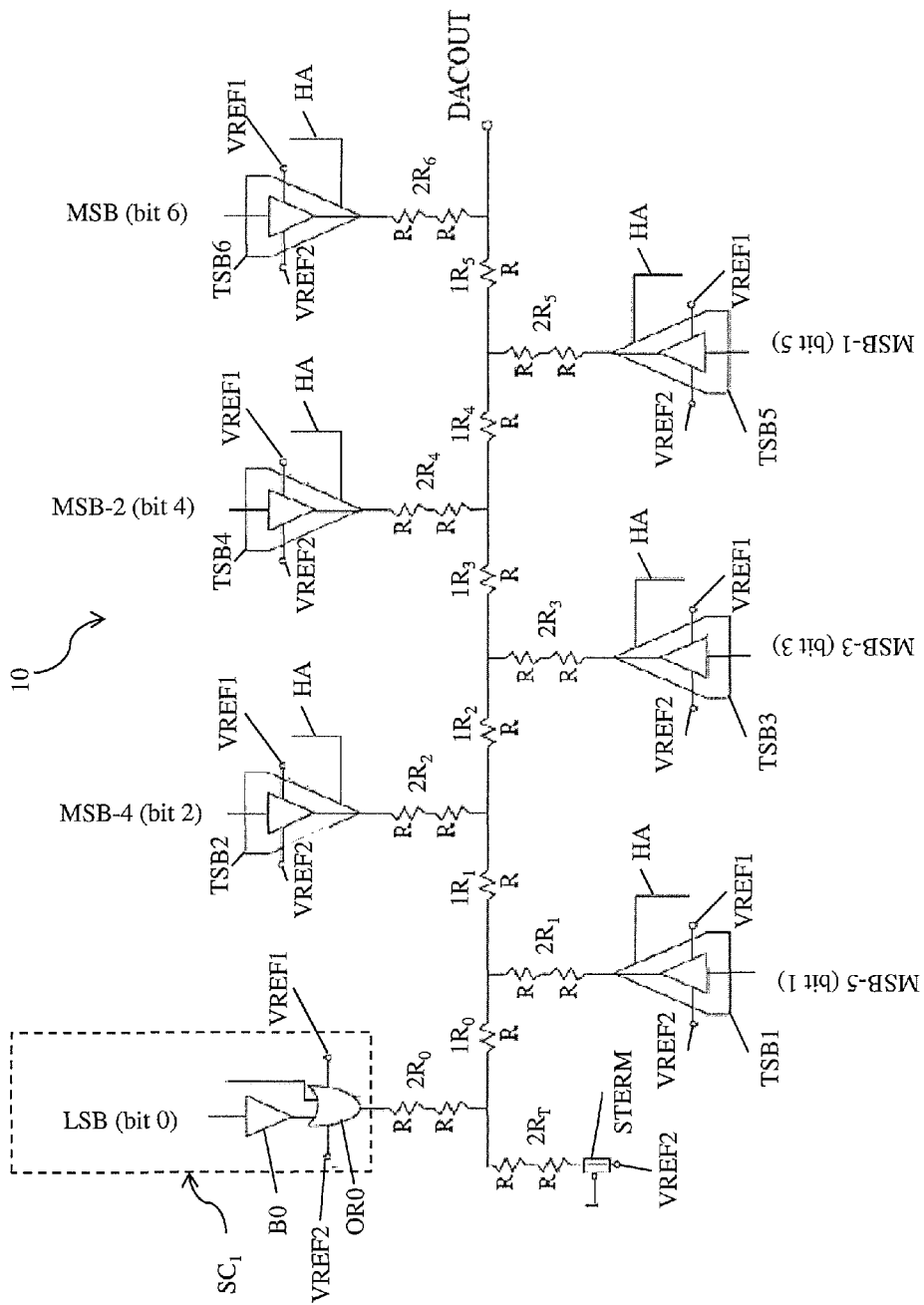
FIG. 2 shows the R-2R DAC with partial resistor network reconfiguration when a half address is 0 in accordance with aspects of the present invention.

FIG. 2 shows the R-2R DAC with partial resistor network reconfiguration 10 when the half address signal HA is 0 in accordance with aspects of the present invention. More specifically, in this configuration, HA=0 and the source of the resistor stack $2R_0$ is determined by the value of the least-significant-bit. Further, in embodiments, the tri-state buffers $TSB_0$-$TSB_6$ are enabled, i.e., connected to the resistor stacks $2R_1$-$2R_6$, and as a result, the source of the resistor stacks $2R_1$-$2R_6$ are determined by their respective digital address bit values. More specifically, the resistor stacks $2R_0$-$2R_6$ are sourced from the voltage supply VREF1 when their respective bit value is 1, and are sourced from ground VREF2 when their respective bit value is 0. Thus, in this configuration, the R-2R DAC with partial resistor network reconfiguration 10 functions like a conventional R-2R DAC.

Figure 3:
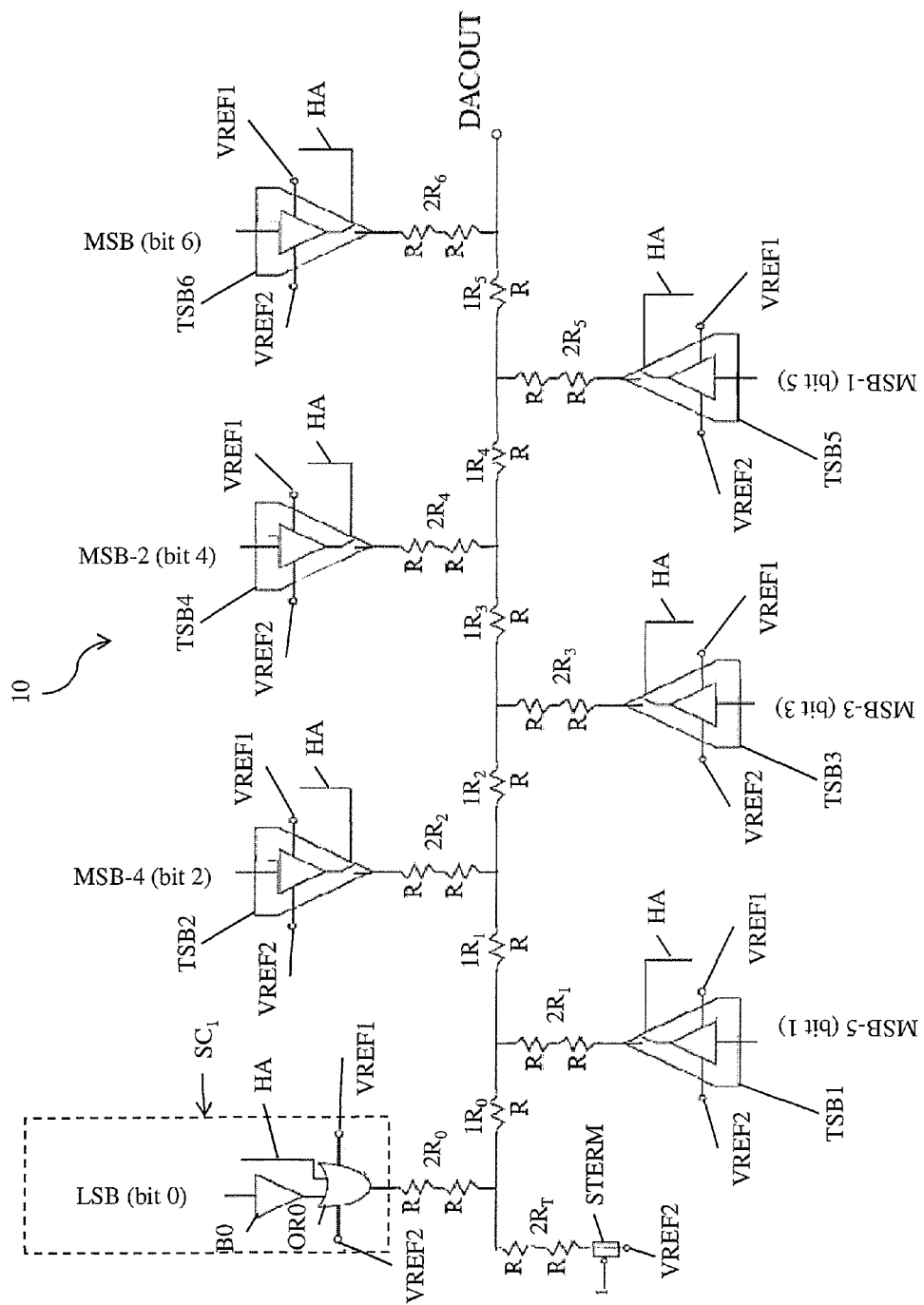
FIG. 3 shows the R-2R DAC with partial resistor network reconfiguration when the half address is 1 in accordance with aspects of the present invention.

FIG. 3 shows the R-2R DAC with partial resistor network reconfiguration 10 when the half address signal HA is 1 in accordance with aspects of the present invention. More specifically, in this configuration, HA=1 and the source resistor stack $2R_0$ is driven to the voltage supply VREF1 by gate OR0 as should be understood by those of ordinary skill in the art.

The tri-state buffers $TSB_0$-$TSB_6$ are tri-stated, e.g., have a high impedance state, and as a result, resistor stacks $2R_1$-$2R_6$ are cut-off from the voltage supply VREF1 and ground VREF2. In this way, the resistor stacks $2R_1$-$2R_6$ do not contribute to current flow or voltage division of the R-2R DAC with partial resistor network reconfiguration 10. Thus, in this configuration, the R-2R DAC with partial resistor network reconfiguration 10 generates a desired output voltage through voltage division between the resistor stack $2R_0$ and the termination resistor stack $2R_T$. Further, although the separation resistors $1R_0$-$1R_5$ remain in the R-2R DAC with partial resistor network reconfiguration 10, they do not contribute to the voltage division.

Figure 4:
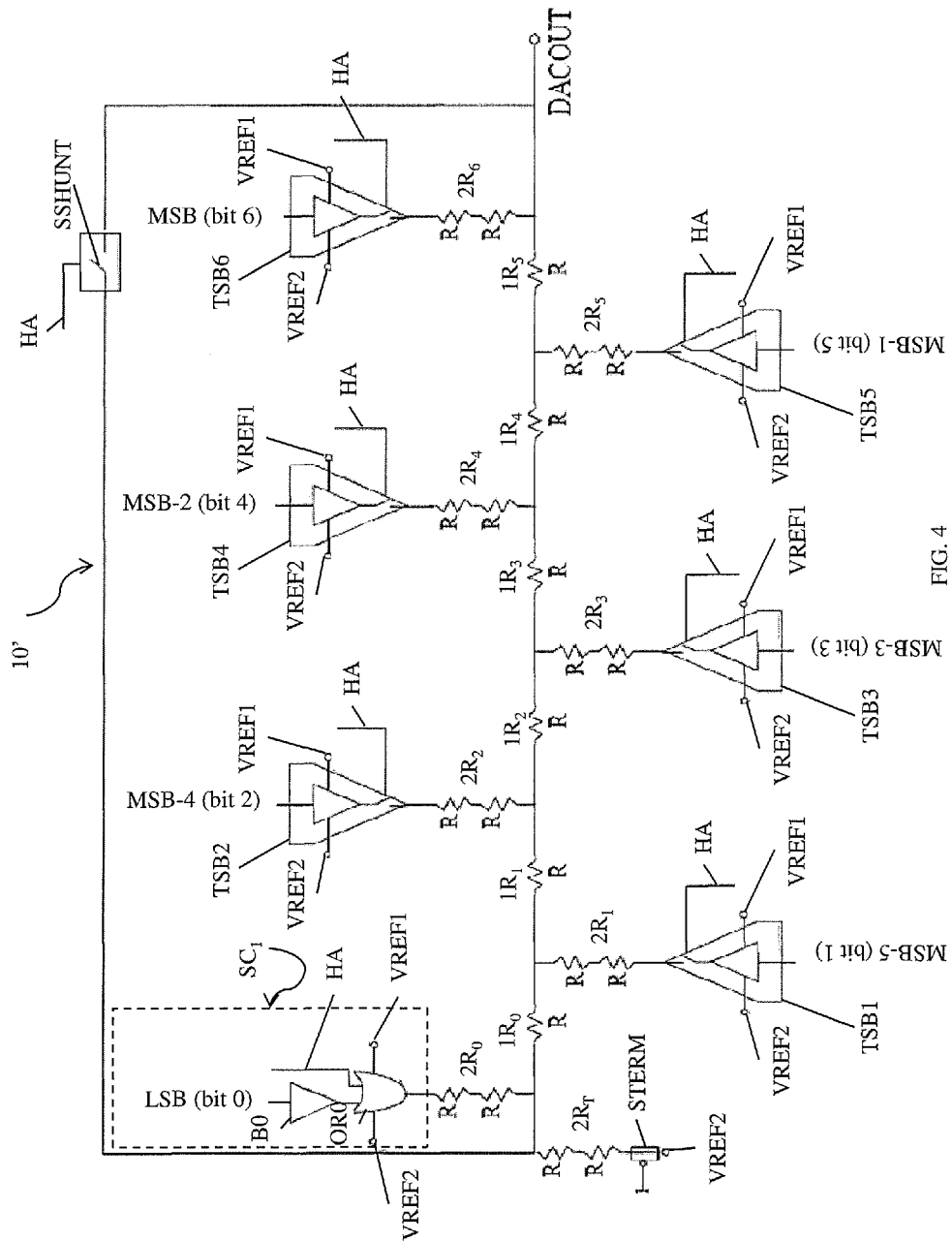
FIG. 4 shows an alternate R-2R DAC with partial resistor network reconfiguration in accordance with aspects of the present invention.

FIG. 4 shows an alternate R-2R DAC with partial resistor network reconfiguration 10' in accordance with aspects of the present invention. More specifically, in comparison to FIG. 1, the R-2R DAC with partial resistor network reconfiguration 10' includes a switch SSHUNT. The remaining structure of FIG. 4 is the same as the structure shown in FIG. 1. More specifically, the R-2R DAC with partial resistor network reconfiguration 10' includes a plurality of resistor stacks $2R_0$-$2R_6$ separated by a plurality of separation resistors $1R_0$-$1R_5$. The R-2R DAC with partial resistor network reconfiguration 10' also includes a termination resistor stack $2R_T$ connected to the drain of the first resistor stack $2R_0$ and an output DACOUT connected to the drain of the last resistor stack $2R_6$.

Further, in embodiments, the R-2R DAC with partial resistor network reconfiguration 10' includes selection circuits coupled to a respective one of the plurality resistor stacks $2R_0$-$2R_6$. In embodiments, a selection circuit $SC_1$ for the resistor stack $2R_0$ includes a buffer B0 and an OR gate OR0. According to aspects of the present invention, the selection circuits for the resistor stacks $2R_1$-$2R_6$ include tri-state buffers $TSB_1$-$TSB_6$.

In embodiments, the switch SSHUNT selectively couples a drain of the first resistor stack $2R_0$ to the output DACOUT. More specifically, the switch SSHUNT closes when HA=1 and as a result, the resistor stack $2R_0$ is connected to the output DACOUT. In this way, the switch SSHUNT bypasses the separation resistors $1R_0$-$1R_5$, thus providing a lower impedance path to the output DACOUT and speeding transition. In contrast, in embodiments, when HA=0, the switch SSHUNT is open and provides a high impedance source between the first resistor stack $2R_0$ and the output DACOUT.

Figure 5:
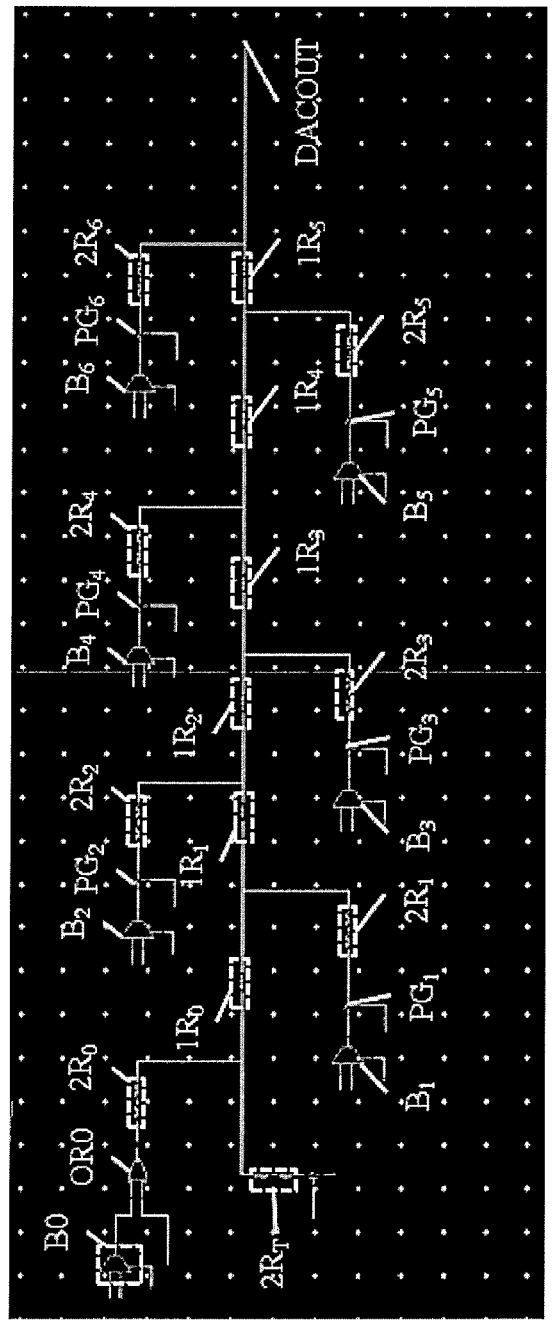
FIG. 5 shows a layout of a test bench used to conduct simulations of the R-2R DAC with partial resistor network reconfiguration in accordance with aspects of the present invention.

FIG. 5 shows a layout of a test bench used to conduct simulations of the R-2R DAC with partial resistor network reconfiguration in accordance with aspects of the present invention. More specifically, using the test bench 20, simulations of the R-2R DAC with partial resistor network reconfiguration 10 of FIG. 1 were conducted to determine the INL and DNL values of the R-2R DAC with partial resistor network reconfiguration 10. The test bench 20 includes a plurality of resistor stacks $2R_0$-$2R_6$, which are separated by separation resistors $1R_0$-$1R_5$. The test bench 20 further includes a termination resistor stack $2R_T$ coupled to a drain of a first resistor stack $2R_0$ of the plurality of resistor stacks. As shown in FIG. 5, the test bench includes selection circuits coupled to a respective one of the plurality of resistor stacks $2R_0$-$2R_6$. More specifically, a logic for resistor stack $2R_0$ includes a series of two logic gates similar to the buffer B0 and OR gate OR0 of FIG. 1, and the tri-state function for resistor stacks $2R_1$-$2R_6$ is modeled as a buffer $B_1$-$B_6$ followed by an ideal pass gate $PG_1$-$PG_6$. The selection circuits for all other resistor stacks, e.g., resistor stacks $2R_1$-$2R_6$ include tri-state buffers $TSB_1$-$TSB_6$. An output DACOUT is connected to a drain the resistor stacks 2R6. During simulations, ideal selection switches written in VerilogA were used to provide logic/source drive functions.

Additionally, simulations using conventional R-2R DACs with larger resistors yield desirable INL and DNL performance. For example, a conventional R-2R DAC having an area of about 28.8 $\mu m^2$, yields INL values of +/−0.281 LSB and DNL values of +/−0.563 LSB. However, peak INL and DNL values were reached at the half address switch. Further simulations using the same conventional R-2R DAC with a resistor area of about 18% of the original area of the R-2R DAC with the larger resistors yield INL values of +/−0.676 LSB and DNL values of +/−1.35 LSB. Similar to the R-2R DAC with larger resistors, the worst case INL and DNL performance occurs at the half address switch in the R-2R DAC with smaller resistors. To the contrary, in accordance with aspects of the present invention, the R-2R DAC with partial resistor network reconfiguration 10 with a resistor area of about 18% of the R-2R DAC with the larger resistor provides for desirable INL and DNL values, as discussed with respect to FIGS. 6 and 7 below. Further, the R-2R DAC with partial resistor network reconfiguration 10 confirms monotonicity at the half address switch.

Figure 6:
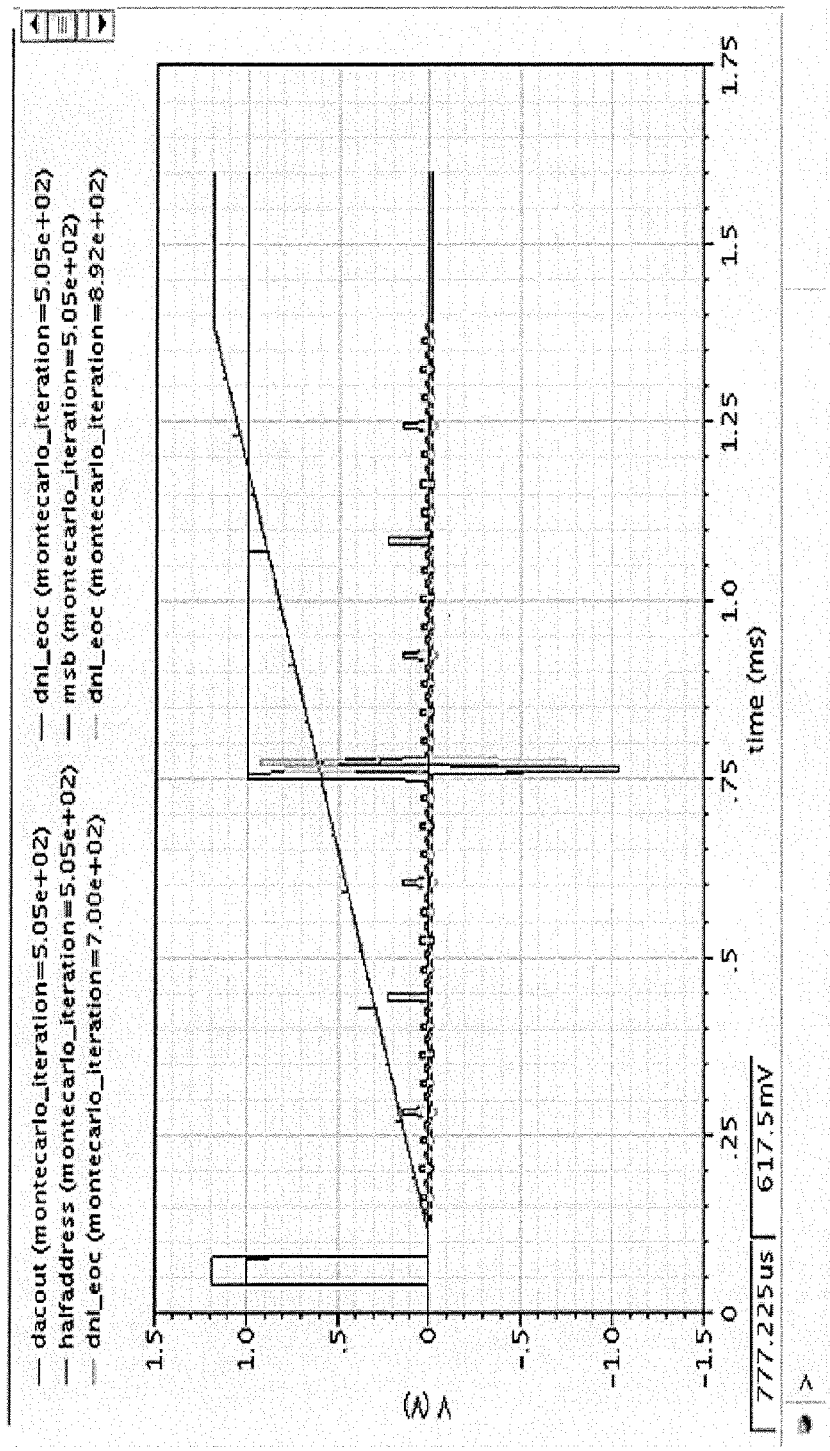
FIG. 6 shows a graph of the DNL performance of the R-2R DAC with partial resistor network reconfiguration in accordance with aspects of the present invention.

FIG. 6 shows a graph of the DNL performance of the R-2R DAC with partial resistor network reconfiguration 10 in accordance with aspects of the present invention. More specifically, FIG. 6 shows the DNL values resulting from the simulations using the test bench 20 of FIG. 5. In embodiments, DNL values of about −1.01+0.9 LSB can be achieved as shown in FIG. 6. That is, according to aspects of the present invention, the R-2R DAC with partial resistor network reconfiguration 10 (or 10') advantageously provides for desirable DNL values and a smaller resistor area, e.g., a resistor area of about 18% of a conventional R-2R DAC having a resistor area of 28.8 $\mu m^2$.

Figure 7:
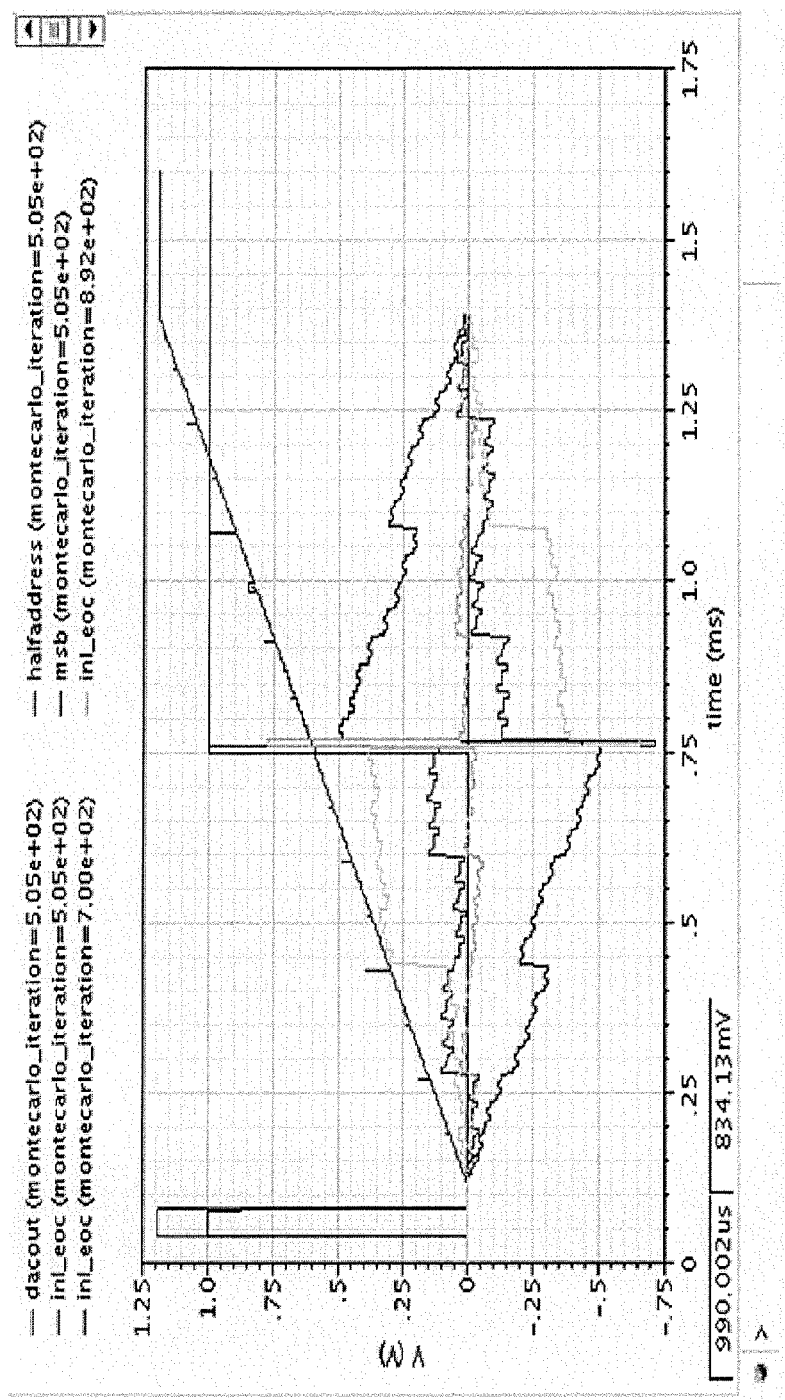
FIG. 7 shows a graph of the INL performance of the R-2R DAC with partial resistor network reconfiguration in accordance with aspects of the present invention.

FIG. 7 shows a graph of the INL performance of the R-2R DAC with partial resistor network reconfiguration 10 in accordance with aspects of the present invention. More specifically, FIG. 7 shows the INL values resulting from the simulations using the test bench 20 of FIG. 5. In embodiments, INL values of about −0.775/+0.712 can be achieved as shown in FIG. 7. That is, according to aspects of the present invention, the R-2R DAC with partial resistor network reconfiguration 10 advantageously provides for desirable INL values and a smaller resistor area, e.g., a resistor area of about 18% of a conventional R-2R DAC having a resistor area of 28.8 $\mu m^2$.

Figure 8:
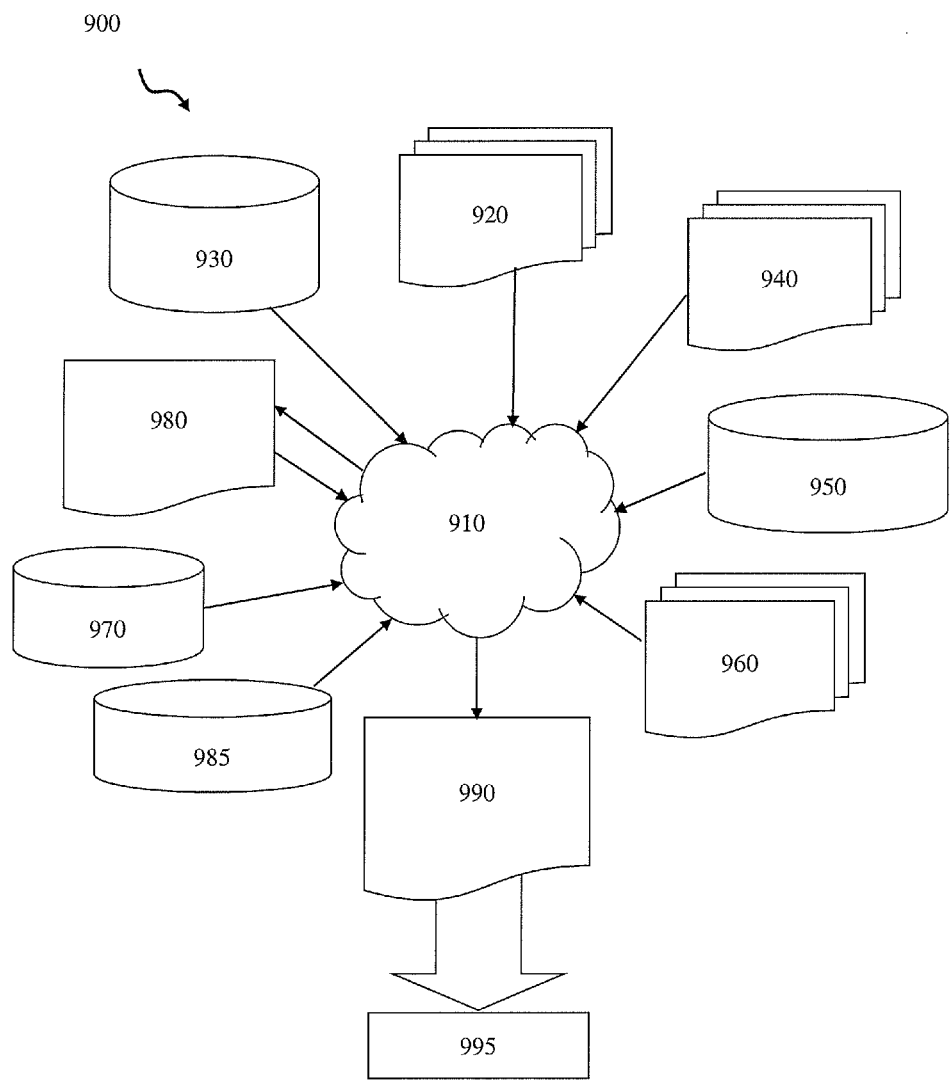
FIG. 8 is a flow diagram of a design process used in semiconductor design, manufacture, and/or test.

FIG. 8 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-4. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-4 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-4. In one embodiment, design structure 990 may comprise a compiled, executable HDL simulation model that functionally simulates the devices shown in FIGS. 1-4.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-4. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A circuit, comprising:
   a plurality of resistor stacks;
   a plurality of separation resistors which separate each of the plurality of resistor stacks;
   a first selection circuit connected to a first resistor stack of the plurality of resistor stacks;
   a plurality of selection circuits connected between the plurality of separation resistors; and
   a termination resistor stack connected to a drain of the first resistor stack, wherein the termination resistor stack is coupled to a selection gate.

2. A circuit, comprising:
a plurality of resistor stacks;
a plurality of separation resistors which separate each of the plurality of resistor stacks;
a first selection circuit connected to a first resistor stack of the plurality of resistor stacks;
a plurality of selection circuits connected between the plurality of separation resistors; and
a termination resistor stack connected to a drain of the first resistor stack,
wherein the first selection circuit comprises a buffer and an OR gate.

3. The circuit of claim 2, wherein:
an input of the buffer is connected to a least significant bit; and
a first input of the OR gate is connected to an output of the buffer and a second input of the OR gate is connected to a half address value (HA).

4. The circuit of claim 3, wherein when HA=0, a source of the first resistor stack is driven by the least-significant-bit.

5. The circuit of claim 3, wherein when HA=1, a source of the first resistor stack is connected to a voltage supply.

6. A circuit, comprising:
a plurality of resistor stacks;
a plurality of separation resistors which separate each of the plurality of resistor stacks;
a first selection circuit connected to a first resistor stack of the plurality of resistor stacks;
a plurality of selection circuits connected between the plurality of separation resistors; and
a termination resistor stack connected to a drain of the first resistor stack,
wherein the plurality of selections circuits include a tri-state buffer.

7. The circuit of claim 6, wherein the plurality of selection circuits are selectively coupled to a respective remaining one the plurality of resistor stacks based on a half address value (HA).

8. The circuit of claim 7, wherein when HA=0:
the plurality of selection circuits are connected to the respective remaining one of the plurality of resistor stacks; and
a source of each of the remaining of the plurality of resistor stacks is driven by a value of a respective digital address bit.

9. The circuit of claim 7, wherein when HA=1:
the plurality of selection circuits are disconnected from the remaining of the plurality of resistor stacks; and
each of the remaining of the plurality of resistor stacks have a high impedance source connection.

10. The circuit of claim 1, further comprising a switch connected to the drain of the first resistor stack, which directly connects the first resistor stack to an output based on a half value (HA), wherein:
when HA=0, the switch is open; and
when HA=1, the switch is closed and the first resistor stack is directly connected to the output.

11. A circuit, comprising:
a plurality of resistor stacks;
a plurality of separation resistors which separate each of the plurality of resistor stacks;
a selection circuit connected to a first resistor stack of the plurality of resistor stacks, the selection circuit comprising a buffer and an OR gate;
a plurality of selection circuits connected to a respective remaining one of the plurality of resistor stacks, the plurality of selection circuits comprising a tri-state buffer; and
a termination resistor stack connected to a drain of the first resistor stack.

12. The circuit of claim 11, wherein:
an input of the buffer is connected to a least significant bit; and
a first input of the OR gate is connected to an output of the buffer and a second input of the OR gate is connected to a half address value (HA).

13. The circuit of claim 12, wherein the plurality of selection circuits are selectively coupled to the respective remaining one of the plurality of resistor stacks based on HA.

14. The circuit of claim 13, wherein when HA=0:
a source of the first resistor stack is determined by the least-significant-bit;
the plurality of selection circuits are connected to the respective remaining one of the plurality of resistor stacks; and
a source of each of the remaining of the plurality of resistor stacks is driven by a value of a respective digital address bit.

15. The circuit of claim 13, wherein when HA=1:
a source of the first resistor stack is connected to a voltage supply; and
each of the remaining of the plurality of resistor stacks have a high impedance source connection.

16. The circuit of claim 11, further comprising a switch connected to the drain of the first resistor stack, which directly connects the first resistor stack to an output based on a half value (HA), wherein:
when HA=0, the switch is open; and
when HA=1, the switch is closed and the first resistor stack is directly connected to the output.

17. A method comprising:
providing a half address value (HA) to a plurality of resistor stacks; and
determining a source connection of the plurality of resistor stacks based on the half address value,
wherein the HA is determined based on a most significant bit (MSB) of a digital address.

18. The method of claim 17, wherein when HA=1:
a first resistor stack of the plurality of resistor stacks is connected to a voltage supply; and
each of a remaining of the plurality of resistor stacks have a high impedance source connection.

19. The method of claim 18, further comprising:
closing a switch when HA=1; and
connecting the first resistor stack directly to an output.

20. The method of claim 17, wherein when HA=0, the source connection of the plurality of resistor stacks is driven by a value of a respective digital address bit provided to the plurality of resistor stacks.

21. The circuit of claim 1, wherein the first selection circuit comprises a buffer and an OR gate, or the plurality of selections circuits include a tri-state buffer.

22. The method of claim 17, wherein the source connection is determined using a buffer and an OR gate, or a tri-state buffer.

23. The method of claim 17, wherein the HA occurs when the MSB is 1 and all other bits are 0.

* * * * *